(12) United States Patent
Lin et al.

(10) Patent No.: US 11,316,274 B2
(45) Date of Patent: Apr. 26, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Cheng-Nan Lin, Kaohsiung (TW); Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 266 days.

(21) Appl. No.: 16/432,662

(22) Filed: Jun. 5, 2019

(65) Prior Publication Data
US 2020/0388928 A1 Dec. 10, 2020

(51) Int. Cl.
| H01Q 1/38 | (2006.01) |
| H01Q 13/18 | (2006.01) |
| H01L 23/31 | (2006.01) |
| H01L 23/66 | (2006.01) |
| H01L 23/29 | (2006.01) |
| H01L 23/498 | (2006.01) |
| H01L 21/56 | (2006.01) |
| H01L 23/13 | (2006.01) |

(52) U.S. Cl.
CPC .......... *H01Q 13/18* (2013.01); *H01L 21/565* (2013.01); *H01L 23/13* (2013.01); *H01L 23/295* (2013.01); *H01L 23/315* (2013.01); *H01L 23/3128* (2013.01); *H01L 23/3135* (2013.01); *H01L 23/49816* (2013.01); *H01L 23/66* (2013.01); *H01Q 1/38* (2013.01); *H01L 23/49822* (2013.01); *H01L 2223/6677* (2013.01)

(58) Field of Classification Search
CPC .... H01Q 13/18; H01Q 9/0414; H01Q 21/065; H01Q 1/38; H01Q 1/40; H01Q 1/2283; H01L 23/3128; H01L 23/66; H01L 23/295; H01L 23/3135; H01L 23/49816; H01L 23/315; H01L 23/13; H01L 23/49822; H01L 23/552; H01L 23/49833; H01L 23/562; H01L 23/3185; H01L 21/565; H01L 21/56; H01L 2223/6677; H01L 2924/18161; H01L 2224/16225
See application file for complete search history.

(56) References Cited

U.S. PATENT DOCUMENTS

| 9,935,065 B1 | 4/2018 | Baheti et al. | |
| 2009/0289343 A1* | 11/2009 | Chiu | H01Q 1/2283 257/690 |
| 2012/0112338 A1* | 5/2012 | Chen | H01L 23/4334 257/712 |
| 2018/0159203 A1* | 6/2018 | Baks | H01Q 1/2283 |
| 2018/0205134 A1* | 7/2018 | Khan | H01Q 5/314 |

FOREIGN PATENT DOCUMENTS

CN 108231750 A 6/2018

* cited by examiner

*Primary Examiner* — Awat M Salih
(74) *Attorney, Agent, or Firm* — Foley & Lardner LLP

(57) ABSTRACT

A semiconductor device package includes a substrate, a first molding compound and antenna layer. The substrate has a first surface and a second surface opposite to the first surface. The first molding compound is disposed on the first surface of the substrate. The antenna layer is disposed on the first molding compound. The substrate, the first molding compound and the antenna layer define a cavity.

15 Claims, 15 Drawing Sheets

US 11,316,274 B2

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same, and to a semiconductor device package including an antenna pattern and a method of manufacturing the same.

2. Description of the Related Art

The development of mobile communication has caused demand for high data rates and stable communication quality, and high frequency wireless transmission (e.g., 28 GHz or 60 GHz) has become one of the most important topics in the mobile communication industry. In order to achieve such high frequency wireless transmission, the signal can be transmitted in a band having wavelengths from about ten to about one millimeter ("millimeter wave," or "mmWave"). However, the signal attenuation is one of the problems in millimeter wave transmission.

SUMMARY

In one or more embodiments, a semiconductor device package includes a substrate, a first molding compound and antenna layer. The substrate has a first surface and a second surface opposite to the first surface. The first molding compound is disposed on the first surface of the substrate. The antenna layer is disposed on the first molding compound. The substrate, the first molding compound and the antenna layer define a cavity.

In one or more embodiments, a semiconductor device package includes a substrate, a support element and an antenna layer. The substrate has a first surface and a second surface opposite to the first surface. The support element is disposed on the first surface of the substrate. The support element has fillers. The antenna layer is disposed on the support element. The substrate, the support element and the antenna layer define a cavity.

In one or more embodiments, a method of manufacturing a semiconductor device package includes (a) providing a substrate having a first surface and a second surface opposite to the first surface, the substrate having an opening penetrating the substrate; (b) forming a molding compound on the first surface and the second surface of the substrate and within the opening, the molding compound exposing a portion of the first surface of the substrate; and (c) disposing an antenna layer on the molding compound disposed on the first surface of the substrate. The first surface of the substrate, the molding compound on the first surface of the substrate and the antenna layer define a cavity.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
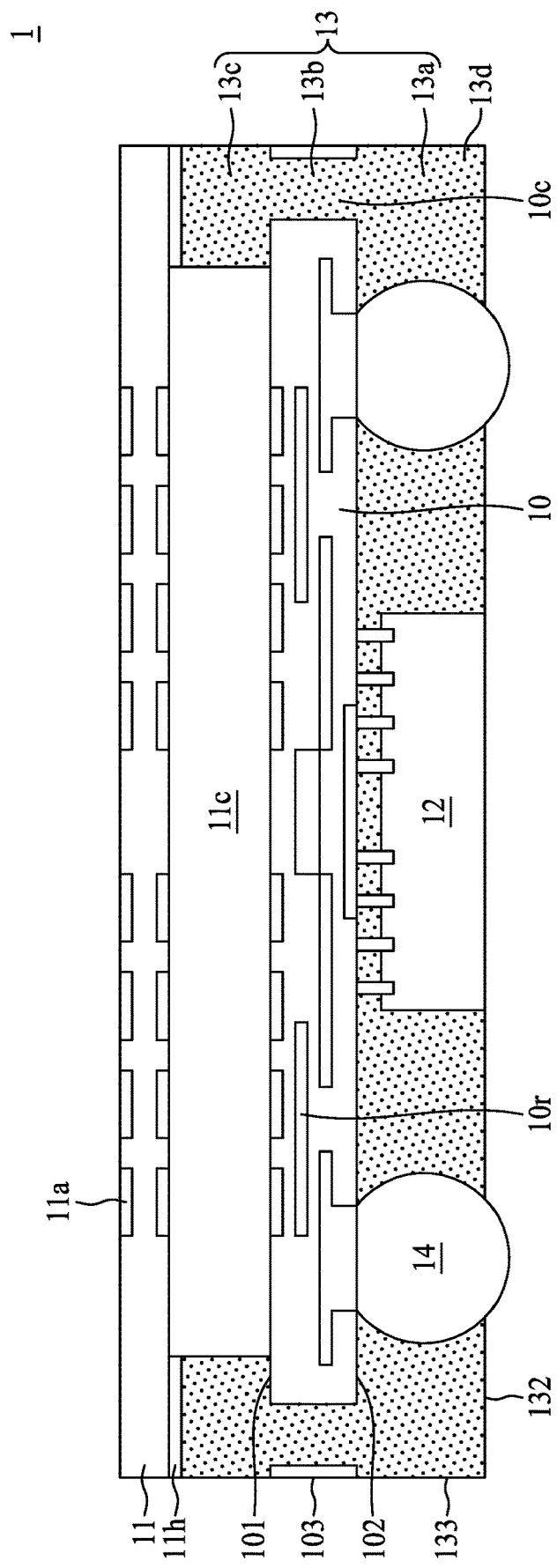
FIG. 1A illustrates a cross-sectional view of a semiconductor device package in accordance with some embodiments of the present disclosure.

FIG. 1A illustrates a cross-sectional view of a semiconductor device package 1 in accordance with some embodiments of the present disclosure. The semiconductor device package 1 includes substrates 10, 11, an electronic component 12, a package body 13 and electrical contacts 14.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10r, such as a redistribution layer (RDL) or a grounding element. In some embodiments, the substrate 10 may be a single-layer substrate or multi-layer substrate which includes a core layer and a conductive material and/or structure disposed on a surface 101 (also can be referred to as a first surface) and a surface 102 (also can be referred to as a second surface) of the substrate 10. The conductive material and/or structure may include a plurality of traces. The substrate 10 includes an opening 10c penetrating the substrate 10. In some embodiments, the opening 10c is located adjacent to edges of the substrate 10.

The electronic component 12 is disposed on the surface 102 of the substrate 10. The electronic component 12 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The electronic component 12 may be electrically connected to the substrate 10 (e.g., to the interconnection structure 10r), and electrical connection may be attained by way of flip-chip or wire-bond techniques.

The electronic component 12 has an active surface facing the surface 102 of the substrate 10 and a back surface opposite to the active surface. In some embodiments, an underfill (not shown) may be disposed between the active surface of the electronic component 12 and the surface 102 of the substrate 10 to cover the active surface of the electronic component 12. In some embodiments, there may be any numbers of active components or passive components disposed on the surface 102 of the substrate 10 depending on different design specifications.

The electrical contacts 14 are disposed on the surface 102 of the substrate 10 to provide electrical connections between the semiconductor device package 1 and any other circuit boards (e.g., substrate, PCB, motherboard or the like) or circuits. In some embodiments, the electrical contacts 14 are solder balls or conductive pillars.

The package body 13 has portions 13a, 13b and 13c. The portion 13a of the package body 13 is disposed on the surface 102 of the substrate 10 to cover or encapsulate a portion of the electronic component 12 and the electrical contacts 14. The back surface of the electronic component 12 is exposed from the package body 13. In some embodiments, the back surface of the electronic component 12 is substantially coplanar with a surface 132 of the package body 13. A portion of the electrical contacts 14 is exposed from the package body 13 for electrical connections. The portion 13b of the package body 13 is disposed within the opening 10c and connected the portion 13a and the portion 13c of the package body 13. The portion 13c of the package body 13 is disposed on at least a portion of the surface 101 of the substrate 10. In some embodiments, the portion of the surface 101 of the substrate 10 on which the portion 13c of the package body 13 is disposed surrounds the opening 10c. In some embodiments, the portion of the surface 101 of the substrate 10 on which the portion 13c of the package body 13 is disposed is adjacent to the edges of the surface 102 of the substrate 10. In some embodiments, a lateral surface 133 of the package body 13 is substantially coplanar with a lateral surface 103 of the substrate 10.

In some embodiments, the package body 13 includes an epoxy resin having fillers 13d, a molding compound (e.g., an epoxy molding compound or other molding compound), a polyimide, a phenolic compound or material, a material with a silicone dispersed therein, or a combination thereof. In some embodiments, the portions 13a, 13b and 13c of the package body 13 include the same material and are formed in a single manufacturing operation. Alternatively, the portions 13a, 13b and 13c of the package body 13 may be formed in separate manufacturing operations depending on different design requirements.

The substrate 11 is disposed over the substrate 10 and spaced apart from the substrate 10. The substrate 11 is disposed on the portion 13c of the package body 13. The substrate 11, the portion 13c of the package body 13 and the substrate 10 define a cavity 11c (or air cavity). For example, there is a gap between the substrate 10 and the substrate 11. In some embodiments, the substrate 11 can be the same as or different from the substrate 10 depending on design specifications.

Figure 1B:
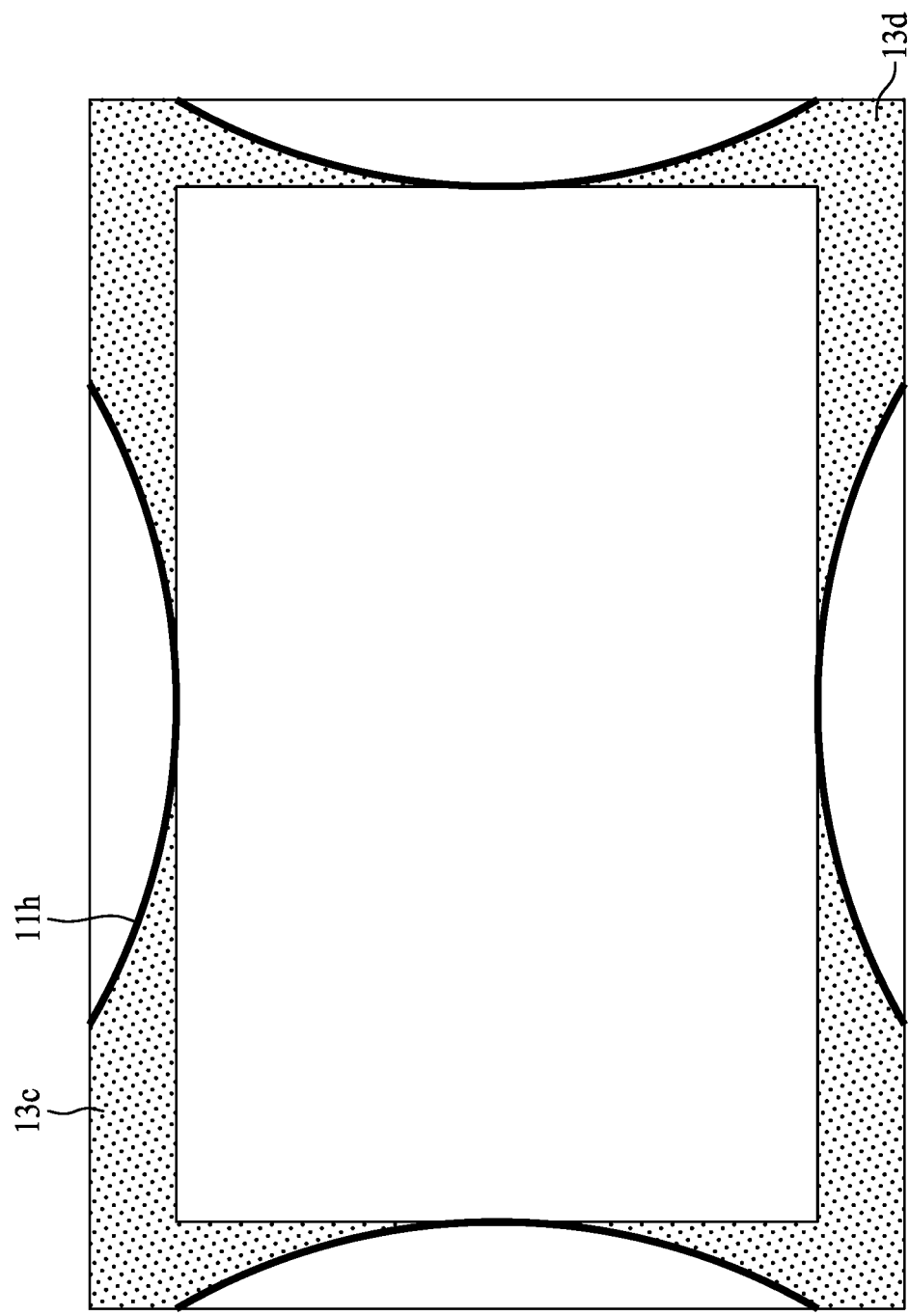
FIG. 1B illustrates a top view of the semiconductor device package shown in FIG. 1A in accordance with some embodiments of the present disclosure.

In some embodiments, the substrate 11 may be attached to the portion 13c of the package body 13 through an adhesion layer 11h (or adhesion element). As shown in FIG. 1B, which illustrates a top view of the semiconductor device package 1 in FIG. 1 (for clarity, the substrate 11 is omitted) in accordance with some embodiments of the present disclosure, the adhesion layer 11h may not define a sealed space. For example, the adhesion layer 11h may include a plurality of portions, and a gap exists between any two adjacent portions. For example, the adhesion layer 11h includes at least one gap to connect the cavity 11c with an outside of the semiconductor device package 1, which can prevent the delamination issue between the substrate 11 and the package body 13 (e.g., popcorn effect) due to the expansion of air during the thermal process for manufacturing the semiconductor device package 1.

The antenna pattern 11a is disposed on or adjacent to both surfaces of the substrate 11. In some embodiments, the antenna pattern 11a includes a plurality of antenna elements. For example, the antenna pattern 11a may include an array of antenna elements. In some embodiments, the antenna pattern 11a may include an M×N array of antenna elements, where M and N are integers equal to or greater than 1. In some embodiments, the antenna pattern 11a may not horizontally overlap the portion 13c of the package body 13, which can avoid the electromagnetic wave transmitted within the cavity 11c from being interfered.

In some comparative implementations, solder balls are used between the substrate 10 and the substrate 11 to define the cavity 11c. However, the dimension of the solder balls (e.g. a height) may vary after every reflow process. Therefore, it is difficult to control the size of each solder ball after the reflow processes and the uniformity of all the solder balls. A large tolerance may exist for the solder balls. For example, the above-described issues may yield a range of variation greater than a desired range of variation (such as ±about 50 μm or greater), which would decrease the efficiency of the resonance of the antenna patterns.

In accordance with the embodiments in FIG. 1A, the package body 13 (e.g., the portion 13c of the package body 13) is disposed between the substrate 10 and the substrate 11 to define the cavity 11c. The height of the cavity 11c is defined by the portion 13c of the package body 13. Since the thermal process has less impact on the variation of the volume of the package body 13 (compared with solder balls), the height of the cavity 11c can be precisely controlled, which would increase efficiency of the resonance of the antenna patterns. In addition, the package body 13 may include the material with fillers 13d such as silicon particles, which would not affect or interfere with the antenna patterns.

Figure 2:
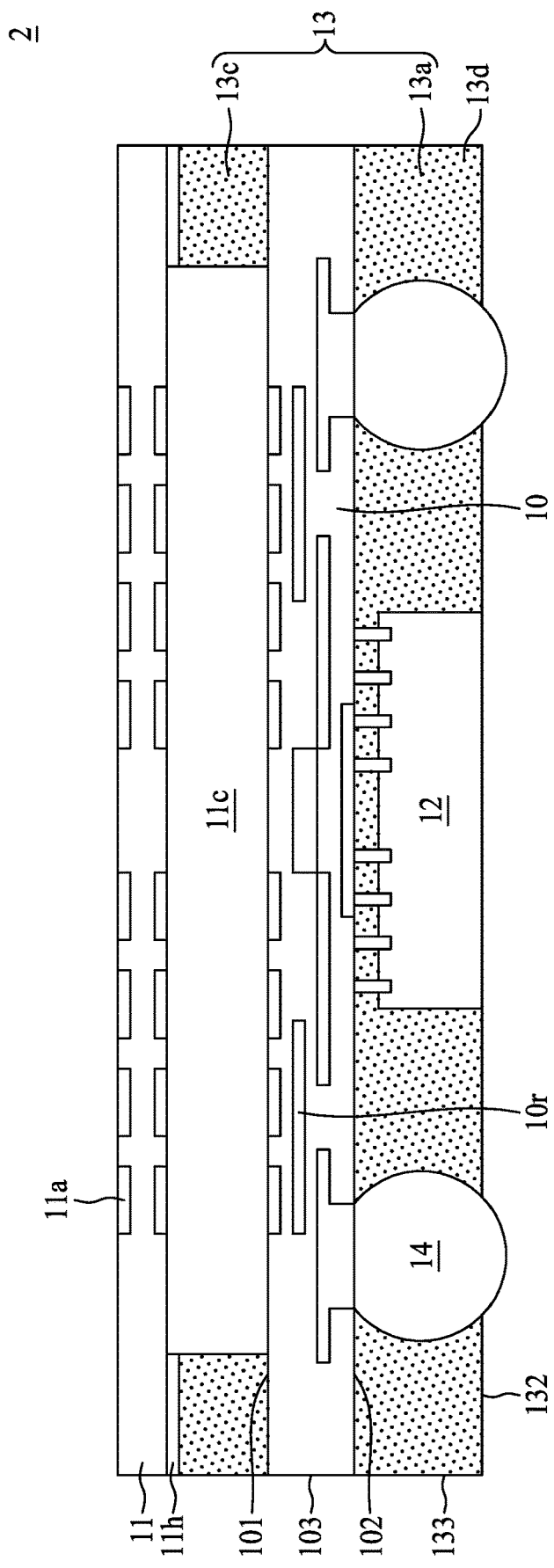
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1A, and the difference therebetween are described below.

As shown in FIG. 2, the substrate 10 does not has an opening to penetrate the substrate 10, and the portion 13b of the package body 13 as illustrated in FIG. 1A is omitted. The portion 13c of the package body 13 is isolated from the portion 13a of the package body 13 by the substrate 10. In some embodiments, the portions 13a and 13c of the package body 13 include the same material and are formed in a single manufacturing operation. Alternatively, the portions 13a and 13c of the package body 13 may be formed in separate manufacturing operations depending on different design specifications.

Figure 3:
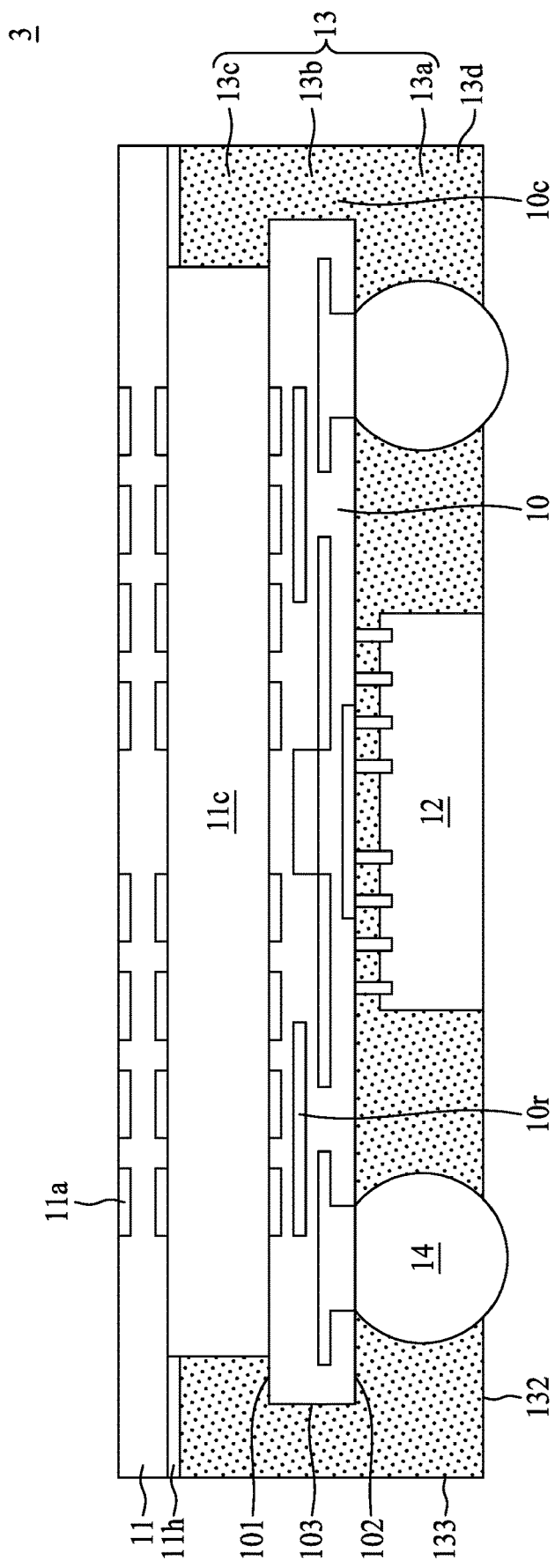
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1A, and the difference therebetween are described below.

As shown in FIG. 3, the opening 10c is located at the edges of the surface 101 of the substrate 10. For example, a lateral surface 103 of the substrate 10 is recessed from a lateral surface 133 of the package body 13. For example, the portion 13c of the package body 13 is disposed on the lateral surface 103 of the substrate 10. For example, the lateral surface 103 of the substrate 10 is fully covered or encapsulated by the package body 13.

Figure 4:
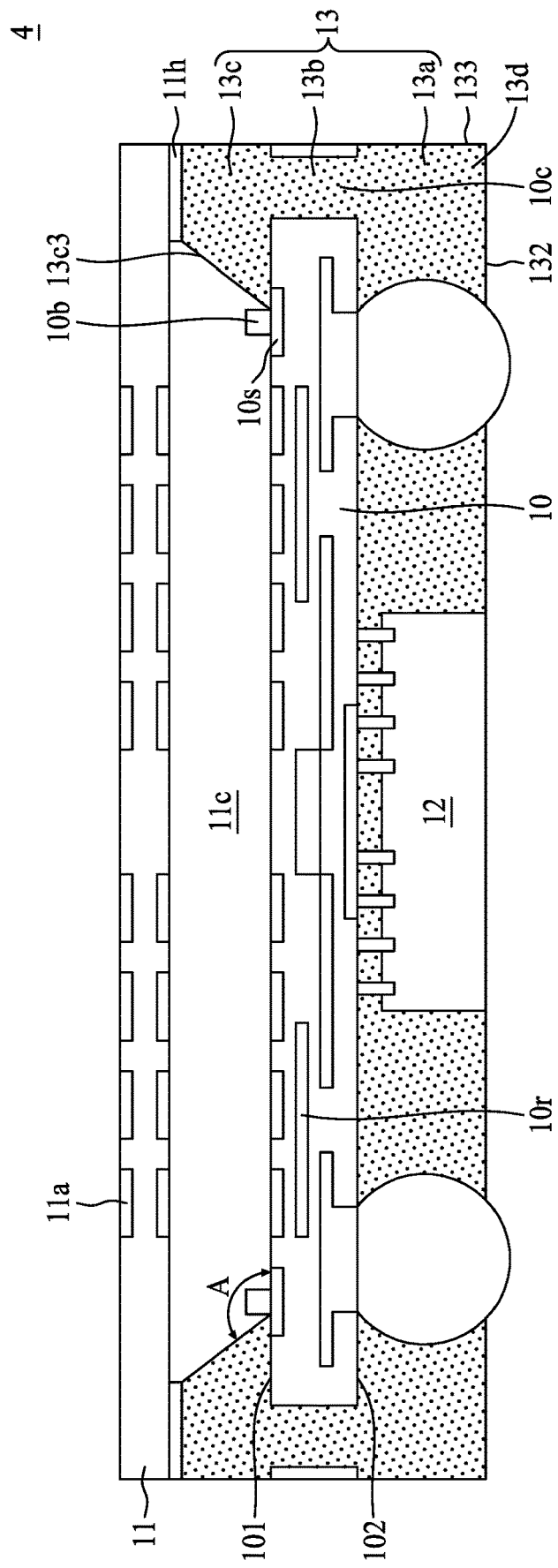
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 1 in FIG. 1A, and the difference therebetween are described below.

The semiconductor device package 4 includes a bump 10b disposed on the surface 101 of the substrate 10. In some embodiments, the bump 10b may be disposed on a conductive pad 10s adjacent to the surface 101 of the substrate 10. In some embodiments, the conductive pad 10s on which the bump 10b is disposed can be used as a stop layer. The portion 13c of the package body 13 has a lateral surface 13c3 facing the cavity 11c. In some embodiments, the lateral surface 13c3 is inclined from the adhesion layer 11h to the bump 10b. For example, a width of the surface of the portion 13c of the package body 13 in contact with the adhesion layer 11h is less than a width of the surface of the portion 13c of the package body 13 on the surface 101 of the substrate 10. For example, the lateral surface 13c3 of the portion 13c of the package body 13 is not perpendicular to the surface 101 of the substrate 10. For example, the lateral surface 13c3 of the package body 13 and the surface 101 of the substrate 10 define an angle A greater than 90 degrees and less than about 110 degrees. In some embodiments, the portion 13c of the package body 13 is in contact with the bump 10b. Alternatively, the portion 13c of the package body 13 may be spaced apart from the bump 10b. In some embodiments, a roughness of the lateral surface 13c3 of the package body 13 is greater than a roughness of the lateral surface 133 of the package body 13.

FIG. 5A, FIG. 5B, FIG. 5C and FIG. 5D are cross-sectional views of a semiconductor structure at various stages of fabrication, in accordance with some embodiments of the present disclosure. Various figures have been simplified to provide a better understanding of the aspects of the present disclosure. In some embodiments, the operations illustrated in FIG. 5A, FIG. 5B, FIG. 5C and FIG. 5D can be used to manufacture the semiconductor device package 1 in FIG. 1A.

Figure 5A:
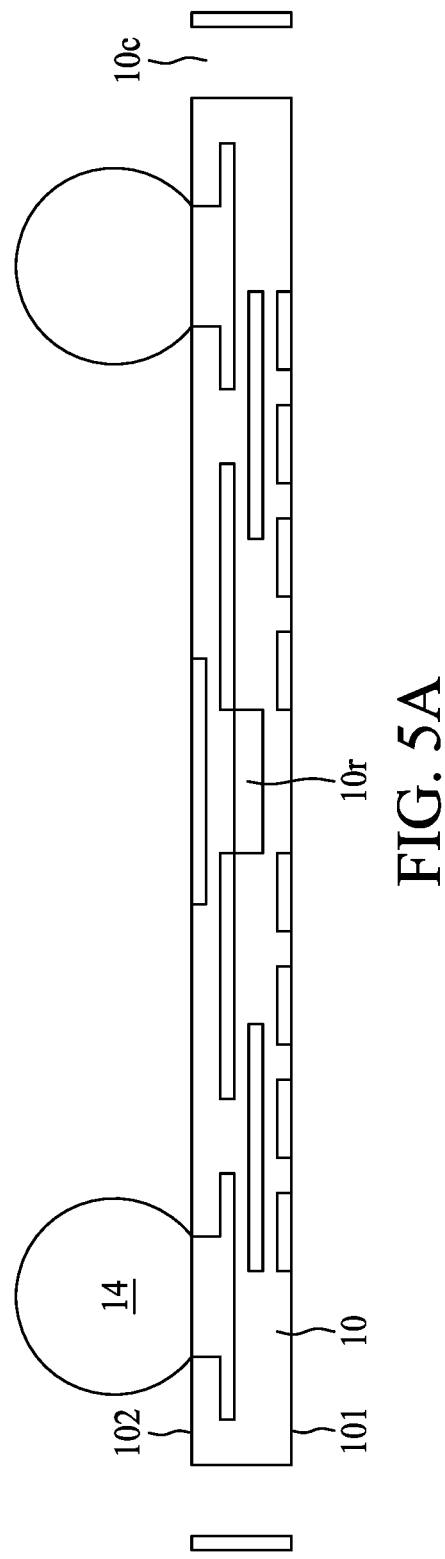
FIG. 5A, FIG. 5B, FIG. 5C and FIG. 5D illustrate a method of manufacturing a semiconductor device package in accordance with some embodiments of the present disclosure.

Referring to FIG. 5A, a substrate 10 is provided. The substrate 10 may include an interconnection structure 10r, such as a redistribution layer (RDL) or a grounding element. The substrate 10 includes an opening 10c penetrating the substrate 10. In some embodiments, the opening 10c is located adjacent to the edges of the surfaces 101 and 102 of the substrate 10. The electrical contacts 14 are mounted on the surface 102 of the substrate 10 and electrically connected to the substrate 10 (e.g., to the conductive pad). In some embodiments, the electrical contacts 14 may be mounted on the surface 102 of the substrate 10 by surface mount technology (SMT) or any other suitable processes.

Figure 5B:
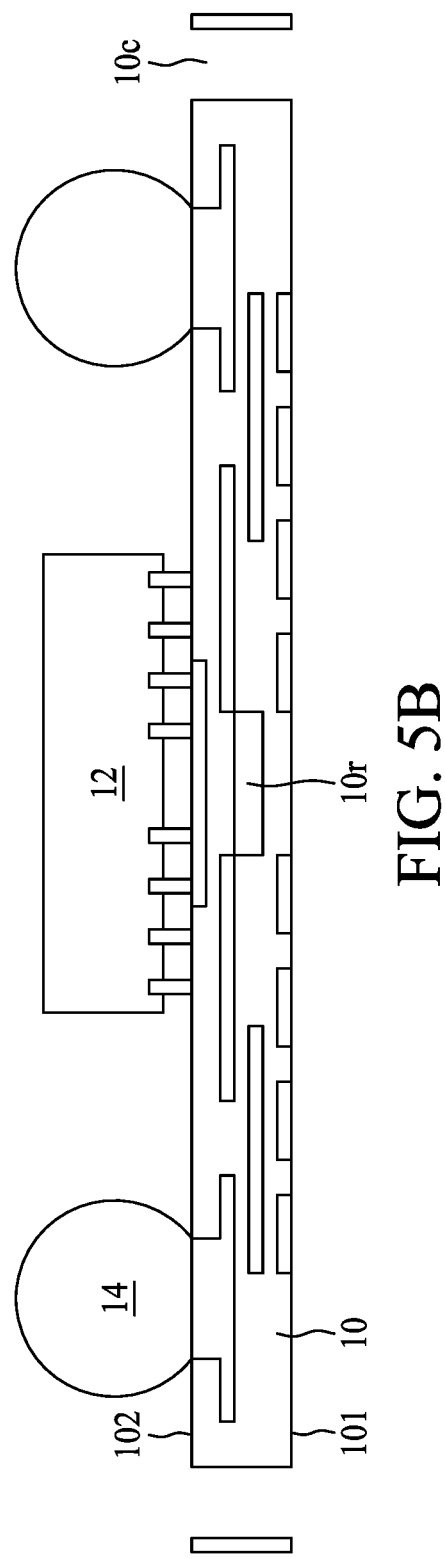

Referring to FIG. 5B, the electronic component 12 is disposed on the surface 102 of the substrate 10 and electrically connected to the substrate 10 (e.g., to the conductive pad). In some embodiments, the electronic component 12 is placed on the surface 102 of the substrate 10 by flip-chip or any other suitable processes. In some embodiments, an underfill may be formed between an active surface of the electronic component 12 and the surface 102 of the substrate 10 to protect the active surface of the electronic component 12. In some embodiments, the order for disposing the electrical contacts 14 and the electronic component 12 can be adjusted or changed depending on different design specifications. Then, a reflow process may be carried out for the electrical contacts 14 and the electronic component 12.

Figure 5C:
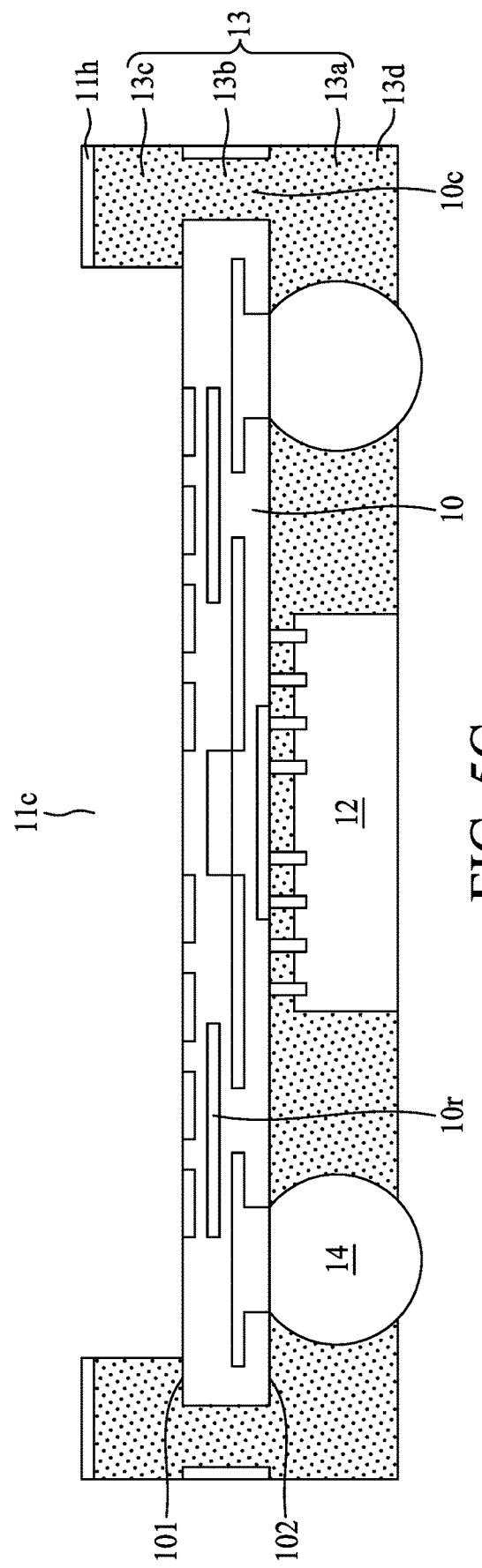

Referring to FIG. 5C, the package body 13 is formed on the surface 102 of the substrate 10, within the opening 10c and on a portion of the surface 101 of the substrate 10. For example, the portion 13a of the package body 13 is formed on the surface 102 of the substrate 10 to cover or encapsulate a portion of the electronic component 12 and the electrical contacts 14. The portion 13b of the package body 13 is formed within the opening 10c. The portion 13c of the package body 13 is formed on at least a portion of the surface 101 of the substrate 10. The adhesion layer 11h is then attached on the portion 13c of the package body 13c.

In some embodiments, the package body 13 is formed by, for example, molding technique (e.g., selective molding, compression molding, transfer molding or the like) or any other suitable processes. In some embodiments, the portions 13a, 13b and 13c of the package body 13 are formed in a single process. For example, the package body 13 can be formed by the following operations: (i) placing the structure in FIG. 5B on a carrier with a adhesion film thereon, so that a portion of the electrical contacts 14 sinks in the adhesion film and the back surface of the electronic component 12 is in contact with the adhesion film; (ii) placing a block structure on a portion of the surface 101 of the substrate 10 where no molding material will be formed; (iii) applying or injecting the molding material from the surface 102 of the substrate 10, and the molding material flowing to the surface 101 of the substrate 10 through the opening 10c; (iv) removing the carrier and the adhesion film to expose the portion of the electrical contacts 14 and the back surface of the electronic component 12; and (v) removing the block structure to leave a cavity 11c defined by the surface 101 of the substrate 10 and the portion 13c of the package body 13.

Figure 5D:
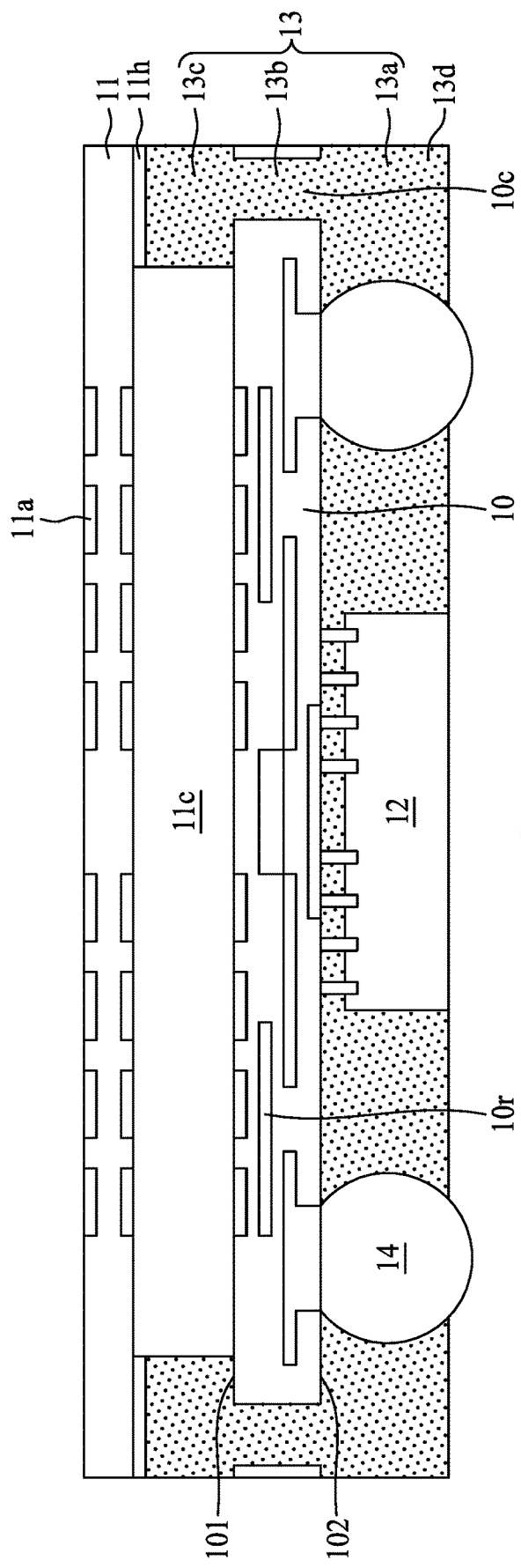

Referring to FIG. 5D, an antenna substrate (including the substrate 11 and an antenna pattern 11a) is placed on the portion 13c of the package body 13 to form the semiconductor device package 1 as shown in FIG. 1A. The antenna substrate is attached to the portion 13c of the package body 13 through the adhesion layer 11h.

Figure 6A:
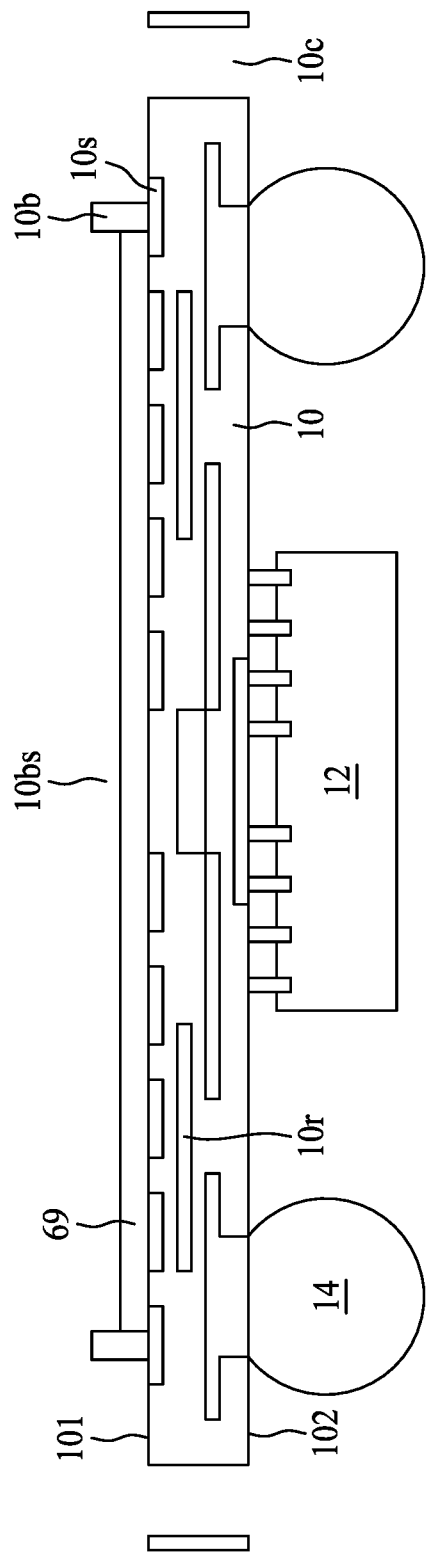
FIG. 6A, FIG. 6B, FIG. 6C, FIG. 6C'.
Figure 6B:
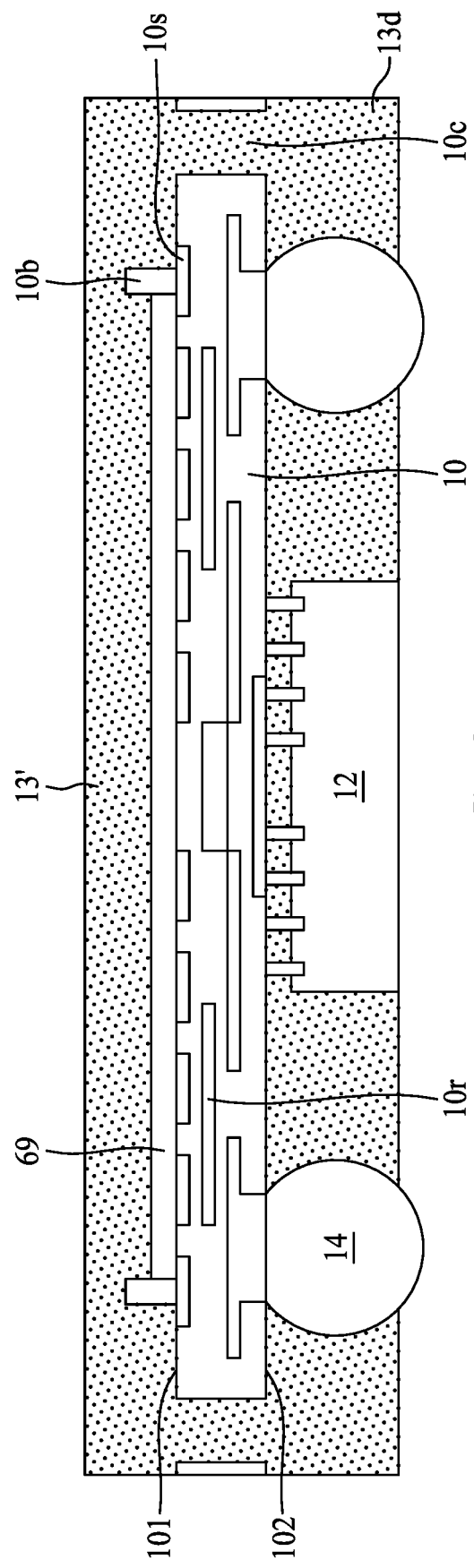
Figure 6C:
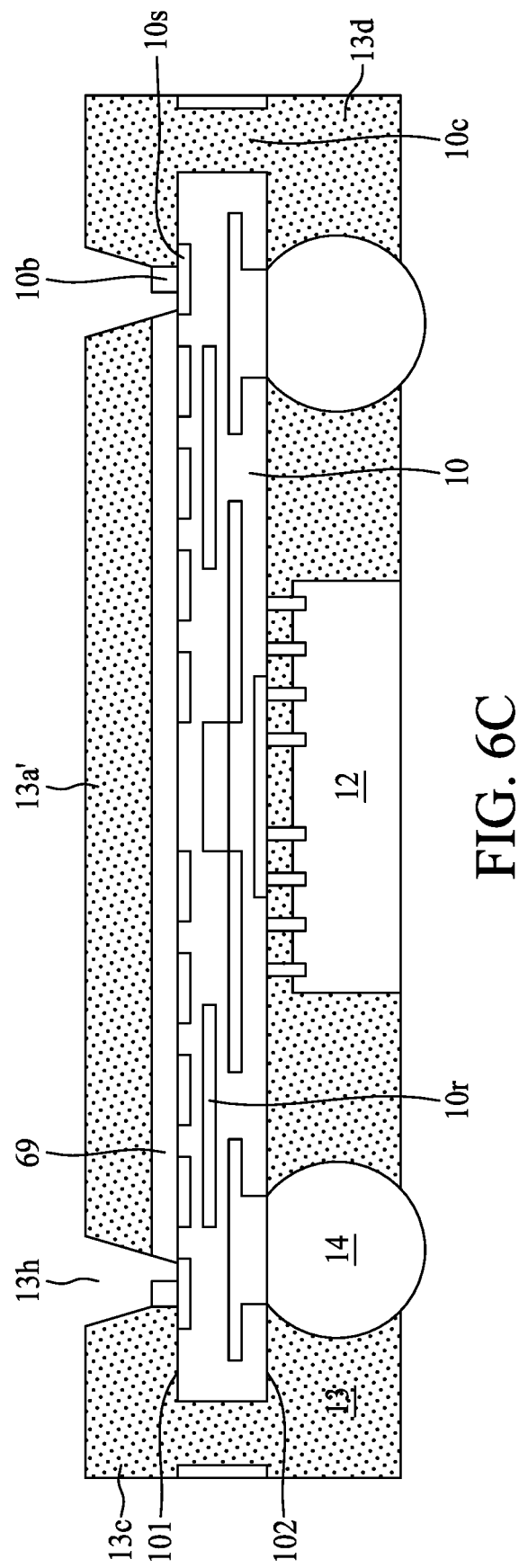
Figure 6C:
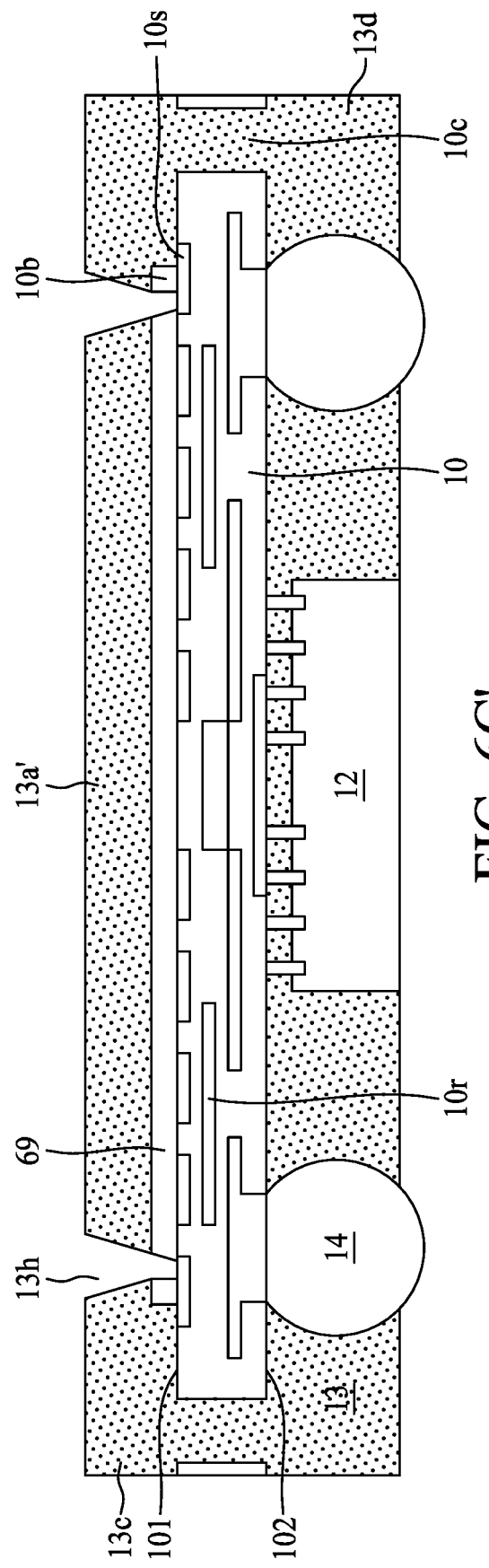
Figure 6D:
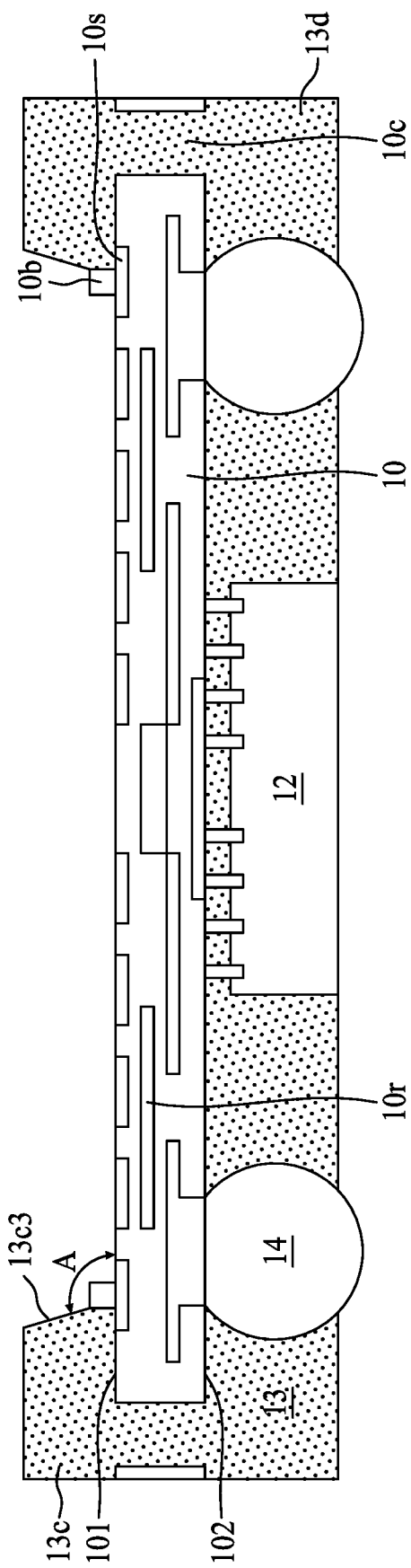
FIG. 6D and FIG. 6E illustrate a method of manufacturing a semiconductor device package in accordance with some embodiments of the present disclosure.
Figure 6E:
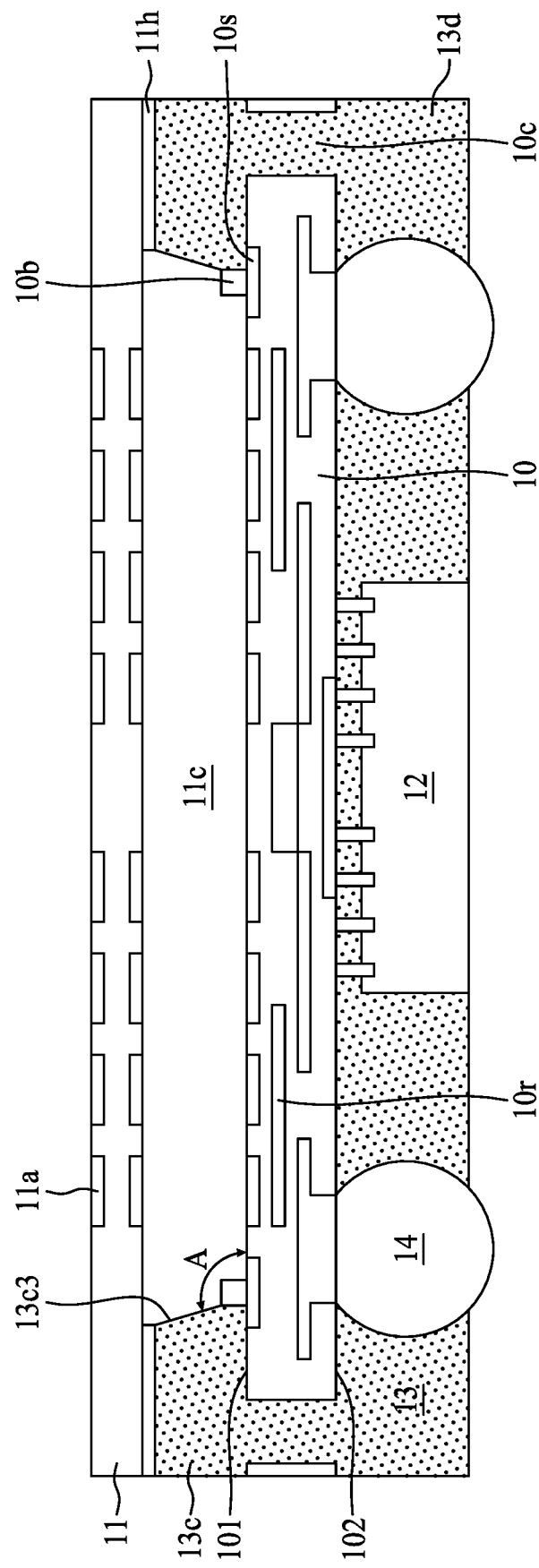

FIG. 6A, FIG. 6B, FIG. 6C, FIG. 6C', FIG. 6D and FIG. 6E are cross-sectional views of a semiconductor structure at various stages of fabrication, in accordance with some embodiments of the present disclosure. Various figures have been simplified to provide a better understanding of the aspects of the present disclosure. In some embodiments, the operations illustrated in FIG. 6A, FIG. 6B, FIG. 6C, FIG. 6C', FIG. 6D and FIG. 6E can be used to manufacture the semiconductor device package 4 in FIG. 4. In some embodiments, the operation in FIG. 6A is carried out subsequent to the operation in FIG. 5B.

Referring to FIG. 6A, a bump 10b is placed or formed on the surface 101 of the substrate 10 (e.g., on the conductive pad 10s adjacent to the surface 101 of the substrate 10) to define a space 10bs. A glue is dispensed on the surface 101 of the substrate 10 and within the space 10bs to form a removable/sacrificial layer 69 on the surface 101 of the substrate 10. In some embodiments, the removable/sacrificial layer 69 can include a tape adhered or taped on the surface 101 of the substrate 10 or another removable binding material coated or printed on the surface 101 of the substrate 10.

Referring to FIG. 6B, a molding material 13' is formed on the surface 101, the opening 10c and the surface 102 of the substrate 10 to cover a portion of the electrical contacts 14, a portion of the electronic component 12, the bump 10b and the removable/sacrificial layer 69.

Referring to FIG. 6C, a portion of the package body 13' is removed to form one or more openings 10c to expose a portion of the removable/sacrificial layer 69. In some embodiments, the openings 10c may be formed by, for example, a laser process or any other suitable processes. Thereby, the package body 13' is divided into two portions 13a' and 13c. The portion 13c is disposed on the surface 101 of the substrate 10, and the portion 13a' is disposed on the removable/sacrificial layer 69.

In some embodiments, the laser process may be performed on both the bump 10b and the conductive pad 10s as shown in FIG. 6C, and hence a top portion of the bump 10b is exposed from the package body 13c after the laser process. In some embodiments, the laser process may be selectively performed on the conductive pad 10s as shown in FIG. 6C', and hence a top portion of the bump 10b is covered by the package body 13c after the laser process.

Referring to FIG. 6D, the removable/sacrificial layer 69 is removed by physical methods or chemical methods, such as a water washing process. Further, the portion 13a' of the package body 13' attached to the removable/sacrificial layer 69 is removed too (e.g., is removed while removing the removable/sacrificial layer 69). After removing the removable/sacrificial layer 69 and the portion 13a' of the package body 13', the portion 13c of the package body 13 remains on the surface 101 of the substrate 10 and a portion of the surface 101 of the substrate 10 is exposed. In some embodiments, the lateral surface 13c3 of the portion 13c of the package body 13 is inclined. For example, the lateral surface 13c3 of the portion 13c of the package body 13 is not perpendicular to the surface 101 of the substrate 10. For example, the lateral surface 13c3 of the package body 13 and the surface 101 of the substrate 10 define an angle A greater than about 90 degrees and less than about 110 degrees.

Referring to FIG. 6E, the adhesion layer 11h is attached on the portion 13c of the package body 13c. An antenna substrate (including the substrate 11 and an antenna pattern 11a) is then placed on the portion 13c of the package body 13 to form the semiconductor device package 4 as shown in FIG. 4. The antenna substrate is attached to the portion 13c of the package body 13 through the adhesion layer 11h.

As used herein, the terms "approximately," "substantially," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate having a first surface and a second surface opposite to the first surface;
   a first encapsulant disposed on the first surface of the substrate and exposing a portion of the first surface;
   an antenna layer disposed above the first encapsulant; and
   an adhesion element disposed between the antenna layer and the first encapsulant,
   wherein the adhesion element, the portion of the first surface of the substrate, the first encapsulant and the antenna layer define a cavity which exposes a lateral surface of the first encapsulant.

2. The semiconductor device package of claim 1, wherein the first encapsulant includes particles.

3. The semiconductor device package of claim 1, wherein the adhesion element includes at least one gap to connect the cavity with an outside of the semiconductor device package.

4. The semiconductor device package of claim 1, further comprising:
   an electronic component disposed on the second surface of the substrate; and
   a second encapsulant disposed on the second surface of the substrate and encapsulating the electronic component.

5. The semiconductor device package of claim 4, wherein the substrate has an opening penetrating the substrate, and the first encapsulant is disposed within the opening.

6. The semiconductor device package of claim 5, wherein the first encapsulant and the second molding compound are integrally formed.

7. The semiconductor device package of claim 1, wherein a lateral surface of the substrate is substantially coplanar with a lateral surface of the first encapsulant.

8. The semiconductor device package of claim 1, further comprising a bump disposed on the first surface of the substrate, wherein the first encapsulant connects the bump and exposes a portion of the bump to the cavity.

9. The semiconductor device package of claim 8, wherein the first encapsulant has a second lateral surface opposite to the first lateral surface, and wherein a roughness of the first lateral surface of the first encapsulant is greater than a roughness of the second lateral surface of the first encapsulant.

10. A semiconductor device package, comprising:
    a substrate having a first surface and a second surface opposite to the first surface;
    a support element disposed on the first surface of the substrate;
    an electronic component disposed on the second surface of the substrate;
    fillers disposed within the support element; and
    an antenna layer disposed on the support element,
    wherein the substrate, the support element and the antenna layer define a cavity,
    wherein the substrate has an opening penetrating the substrate, and the support element is extending from the first surface to the second surface through the opening and encapsulates the electronic component, and
    wherein the cavity is free from overlapping with the opening.

11. The semiconductor device package of claim 10, wherein the fillers includes silicon particles.

12. The semiconductor device package of claim 10, further comprising an adhesion element disposed between the antenna layer and the support element, wherein the adhesion element uncovers the antenna layer.

13. The semiconductor device package of claim 10, further comprising a bump disposed on the first surface of the substrate, wherein the support element has a first lateral surface facing the cavity and inclined from the antenna layer to the bump.

14. The semiconductor device package of claim 13, wherein the support element has a second lateral surface opposite to the first lateral surface, and wherein a roughness of the first lateral surface of the support element is greater than a roughness of the second lateral surface of the support element.

15. The semiconductor device package of claim 10, wherein the cavity exposes a lateral surface of the support element.

* * * * *